United States Patent [19]

Masumura et al.

[11] Patent Number: 5,667,567
[45] Date of Patent: Sep. 16, 1997

[54] POLISHING AGENT USED FOR POLISHING SILICON WAFERS AND POLISHING METHOD USING THE SAME

[75] Inventors: Hisashi Masumura; Kiyoshi Suzuki, both of Fukushima-ken, Japan

[73] Assignee: Shin-Etsu Handotai Co., Ltd., Tokyo, Japan

[21] Appl. No.: 755,802

[22] Filed: Dec. 16, 1996

Related U.S. Application Data

[63] Continuation of Ser. No. 455,716, May 31, 1995, abandoned.

[30] Foreign Application Priority Data

Jun. 2, 1994 [JP] Japan .................... 6-121250

[51] Int. Cl.$^6$ .................................... C09G 1/02
[52] U.S. Cl. .................................... 106/3; 51/308
[58] Field of Search .................. 106/3; 51/308; 451/41; 156/636.1

[56] References Cited

U.S. PATENT DOCUMENTS

| | | | |
|---|---|---|---|
| 4,462,828 | 7/1984 | Otsuki | 106/10 |
| 4,579,564 | 4/1986 | Smith | 51/293 |
| 4,842,837 | 6/1989 | Shimizu et al. | 423/335 |
| 5,226,930 | 7/1993 | Sasaki | 51/308 |
| 5,352,277 | 10/1994 | Sasaki | 51/308 |

FOREIGN PATENT DOCUMENTS

| | | | |
|---|---|---|---|
| 0 373 501 A3 | 6/1990 | European Pat. Off. | |
| 0 520 109 A1 | 12/1992 | European Pat. Off. | |
| 2009571 | 1/1990 | Japan . | |
| 3108650 | 5/1991 | Japan . | |
| 4-313224 | 11/1992 | Japan | 51/308 |
| 1189668 | 11/1985 | U.S.S.R. | 51/308 |
| 1373551 | 2/1988 | U.S.S.R. | 51/308 |
| 1371891 | 2/1988 | U.S.S.R. | 51/308 |

OTHER PUBLICATIONS

J. of Non–Crystalline Solids, 149 (Nov. 1992) 161–178, "Particle morphology and chemical microstructure of colloidal silica spheres made from alkoxysilanes", Blaaderen and Kentgenz.

Japanese Industrial Standard K 6301 "Spring Type Hardness Test (A and C)". No Date.

*Primary Examiner*—Anthony Green
*Attorney, Agent, or Firm*—Nikaido, Marmelstein, Murray & Oram LLP

[57] ABSTRACT

A polishing agent used for polishing a silicon wafer is composed of a colloidal silica polishing agent containing an ethyl silicate monomer and/or an ethyl silicate polymer. Even when the polishing agent is used with a rigid polishing pad, it is able to provide a polished wafer having an excellent flatness and whose surface has a roughness comparable to that obtained by the conventional final polishing process.

6 Claims, 4 Drawing Sheets

POLISHING AGENT USED FOR POLISHING SILICON WAFERS AND POLISHING METHOD USING THE SAME

This application is a continuation application of Ser. No. 08/455,716 filed May 31, 1995, abandoned.

BACKGROUND OF THE INVENTION

1. Field of the Invention:

The present invention relates to a polishing medium or agent used for polishing silicon wafers and a polishing method using the same.

2. Description of the Related Art:

The polishing process is achieved in order to improve flatness and surface roughness of silicon wafers (hereinafter may be referred to, for brevity, as "wafer"). Insofar as the flatness is concerned, rigid polishing pads are preferable because the use of soft polishing pads results in deterioration of the flatness. However, the use of such rigid polishing pads encounter a problem that the surface roughness of polished wafers is very low. To improve the surface roughness, the wafers once polished by the rigid polishing pad should be polished again by using a soft polishing pad. Thus, the conventional polishing process should be a two-stage polishing process composed of a stock-removal rough polishing step using a rigid polishing pad, and a final polishing step using a soft polishing pad.

SUMMARY OF THE INVENTION

With the foregoing problems in view, it is an object of the present invention to provide a novel polishing agent which is capable of providing a polished silicon wafer having an excellent flatness and a surface roughness comparable to that obtained by the conventional final polishing process even when it is used in combination with a rigid polishing pad.

Another object of the present invention is to provide a silicon-wafer polishing method which is capable of providing a silicon wafer with excellent flatness and surface roughness through a single-stage polishing process using the novel polishing agent together with the rigid polishing pad.

In one aspect, the present invention seeks to provide a polishing agent for polishing a silicon wafer, comprising a colloidal silica polishing agent containing an ethyl silicate monomer and/or an ethyl silicate polymer.

The content of the ethyl silicate monomer and/or the ethyl silicate polymer is in the range of 0.1 to 10.0 percent by volume, preferably 0.1 to 5.0 percent by volume, and optimally 1.0 to 5.0 percent by volume relative to the total amount of the polishing agent.

The ethyl silicate monomer and the ethyl silicate polymer can be used either alone or in combination by mixing them in a selected proportion.

In another aspect, the present invention seeks to provide a method of polishing a silicon wafer, characterized by using the polishing agent specified above in combination with a rigid polishing pad. The polishing pad preferably has a hardness in the range of 80 to 95 according to Asker C-scale.

The ethyl silicate (which is defined as a monomer and/or a polymer of an alcoholic silica sol) is used as a caking agent, and when mixed with a powdered or granulated solid material, it acts to form an $SiO_2$ film encapsulating each particle while filling up a gap or space between adjacent particles.

Attention was drawn by the present inventors to a possibility that when an ethyl silicate is added to a colloidal silica polishing agent, an $SiO_2$ film is formed over the surface of a colloidal silica and the surface of a silicon wafer while filling up a space or gap therebetween; the thus formed $SiO_2$ film has an effect (cushioning effect) of softening or smoothening the contact between the colloidal silica particles and the silicon wafer surface, thus making it possible to provide a polished surface even when a rigid polishing pad is used.

After a prolonged study of the wafer polishing technique achievable with the use of a colloidal silica polishing agent containing an ethyl silicate, the present inventors found the fact that a smooth surface whose roughness is improved to such an extent comparable to one obtained by the conventional final polishing can be obtained even when a rigid polishing pad is used in place of a soft polishing pad. Based on this finding, the present invention was completed.

The above and other objects, features and advantages of the present invention will become manifest to those versed in the art upon making reference to the detailed description and the accompanying sheets of drawings.

DETAILED DESCRIPTION

The present invention will be described below in greater detail by way of the following examples which should be construed as illustrative rather than restrictive.

Figure 4:
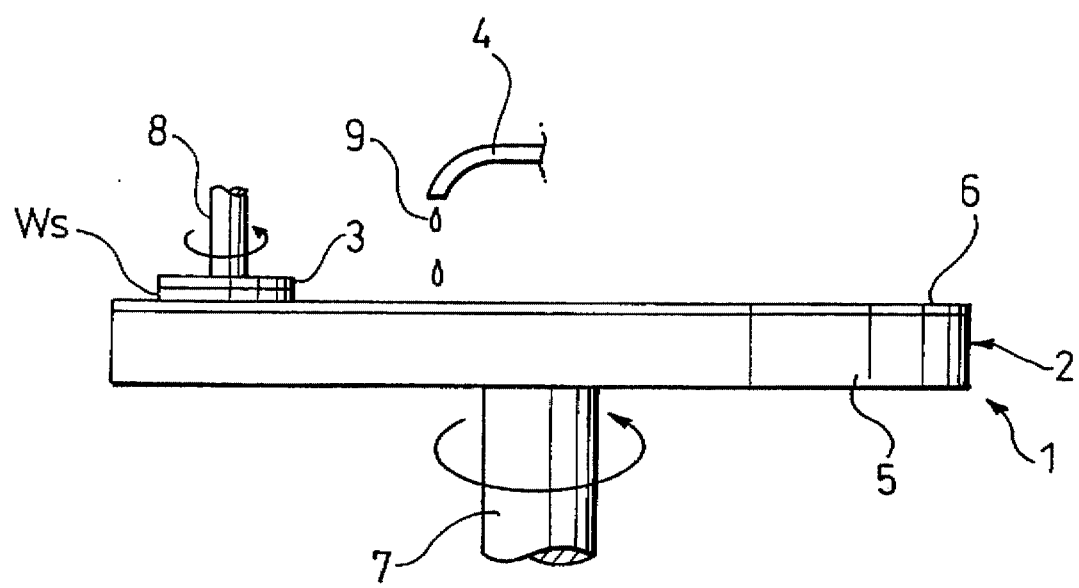
FIG. 4 is an elevational view of an apparatus for polishing a wafer.

FIG. 4 shows an apparatus 1 for polishing a single crystal silicon wafer 70, to carry out polishing processes in Examples 1–4 and Comparative Examples 1–2.

In FIG. 4, the apparatus 1 comprises a rotary table assembly 2, a rotary wafer carrier 3, and a polishing agent supplying member 4. The rotary table assembly 2 comprises a rotary table 5 and a polishing pad 6 adhered on the upper surface of the rotary table 5. The rotary table 5 can rotate on a shaft 7 at a predetermined rotation speed by a driving device such as a motor. The polishing pad 6 comprises a polyurethane foam, a polyester, a nonwoven fabric or the like. The rotary wafer carrier 3 is for holding to carry the wafer 70 on the polishing pad 6 of the rotary table assembly 2 so that the surface of the wafer 70 faces to the polishing pad 6. The wafer carrier 3 can rotate on a shaft 8 at a predetermined rotation speed and horizontally move on the polishing pad 6 by an appropriate driving device such as a motor. During operation of the apparatus 1, the wafer 70 held by the wafer carrier 3 is in contact with the polishing pad 6 and proper polishing loads are applied to the wafer 70 in a downward direction through the shaft 8 and the wafer carrier 3. The polishing agent supplying member 4 is for supplying a polishing agent 9 on the polishing pad 6 to supply it between the wafer 70 and the polishing pad 6. The polishing agent 9 is a conventional colloidal silica agent or the present inventive agent.

EXAMPLE 1

Condition:

Sample wafers: Czochralski-grown p-type, <100>-oriented, 150-mm-diameter, single crystal silicon wafer Polishing pad: Nonwoven fabric (velour-type), hardness= 86 (Asker C-scale)

Polishing agent: 10.0 vol % of AJ-1325 (tradename for a stock solution of colloidal silica polishing agent manufactured by Nissan Chemical Industries, Ltd.), 2.5 vol % of Ethyl Silicate 28 (tradename for an ethyl silicate monomer manufactured by Colcoat, Inc.) and 87.5 vol % of pure water Polishing load: 400 g/cm$^2$ Polishing time: 10 min.

Figure 1:
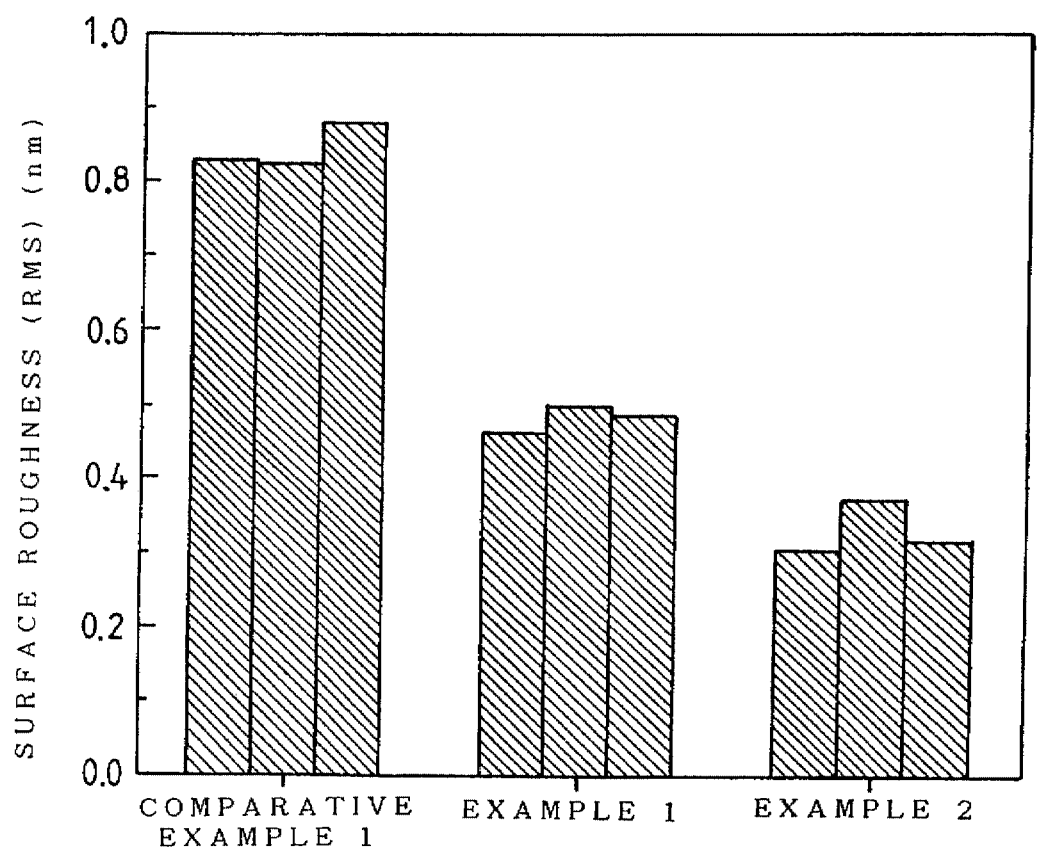
FIG. 1 is a graph showing the surface roughness of different wafers polished according to Examples 1 and 2 and Comparative Example 1.

Under the condition specified above, the sample wafers were polished. Then, surface roughness of the polished wafers was measured by means of an optical interference-type roughness tester (WYKOTOPO-3D, 250 µm☐ manufactured by WYKO, Inc.). The results of this measurement (expressed in terms of root mean square) are shown in FIG. 1. Using a TTV (Total Thickness Variation) measuring device (ADE Microscan 8300 manufactured by ADE, Inc.), a measurement was made for flatness of the polished wafer surfaces with the results shown in FIG. 2. The TTV is defined as difference between the maximum and minimum values of thickness encountered in the polished wafer.

EXAMPLE 2

Figure 2:
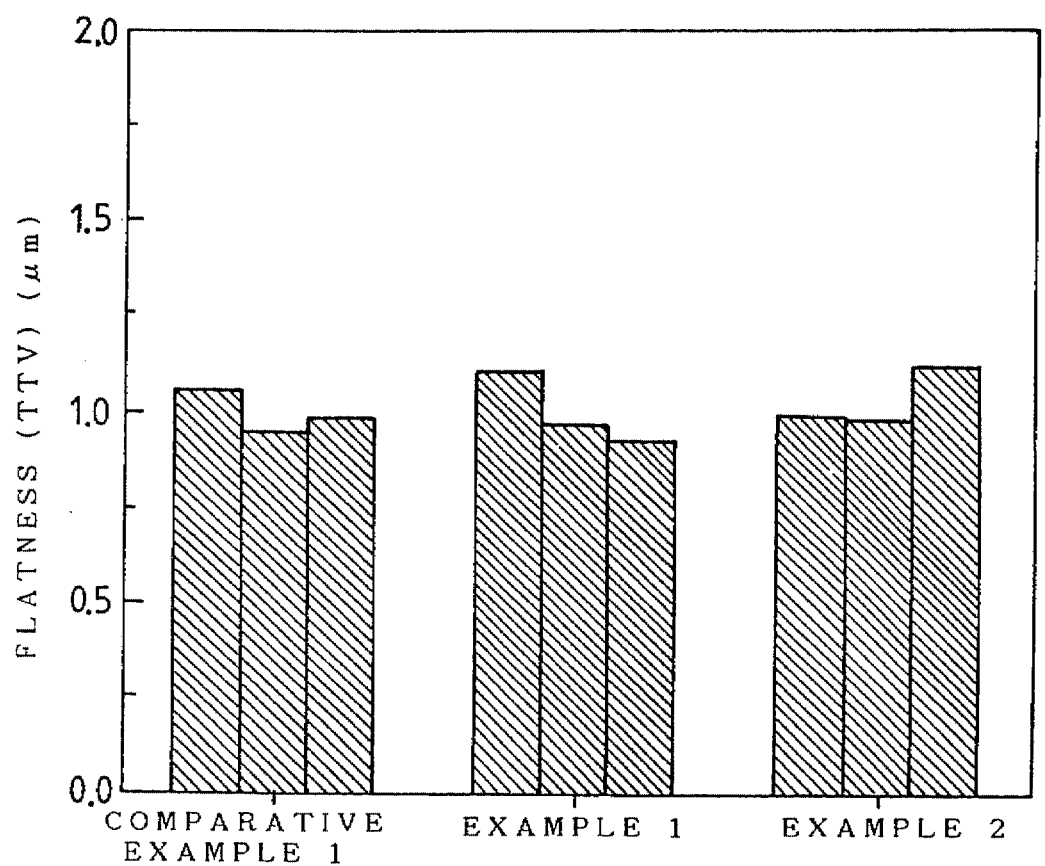
FIG. 2 is a graph showing the flatness of the wafers polished according to Examples 1 and 2 and Comparative Example 1.

Example 1 was repeated with the difference that the aforesaid polishing agent was formulated as containing 10.0 vol % of AJ-1325 specified above, 2.5 vol % of Ethyl Silicate 40 (tradename for an ethyl silicate polymer manufactured by Colcoat, Inc.), and 87.5 vol % of pure water. The results of the surface roughness measurement and the results of the flatness measurement are also shown in FIGS. 1 and 2, respectively.

COMPARATIVE EXAMPLE 1

Example 1 was repeated by using a different polishing agent containing 10 vol % of AJ-1325 specified above, and 90 vol % of pure water. The results of the surface roughness measurement and the results of the flatness measurement are also shown in FIGS. 1 and 2, respectively.

The results obtained from Examples 1 and 2 has proved that in terms of surface roughness and flatness (TTV), the wafer surfaces polished with the use of the polishing agents of this invention reached to the level of a surface obtained by final polishing.

As is apparent from FIGS. 1 and 2, the polished wafer surfaces obtained by using the colloidal silica polishing agent of Comparative Example 1 are comparable to those of Examples 1 and 2 in respect of the flatness. But, regarding the surface roughness, the polished wafer surfaces of Comparative Example 1 are much poorer than those of Examples 1 and 2.

EXAMPLES 3 AND 4 AND COMPARATIVE EXAMPLE 2

Condition:

Sample wafers: Czochralski-grown p-type, <100>-oriented, 150-mm-diameter, single crystal silicon wafer Polishing pad: Nonwoven fabric (velour-type), hardness= 85 (Asker C-scale)

Polishing agent: AJ-1325 specified above (10 vol %)+Ethyl Silicate 28 specified above (selected vol % described below) +pure water (remainder)

Polishing load: 400 g/cm$^2$

Polishing time: 10 min.

Figure 3:
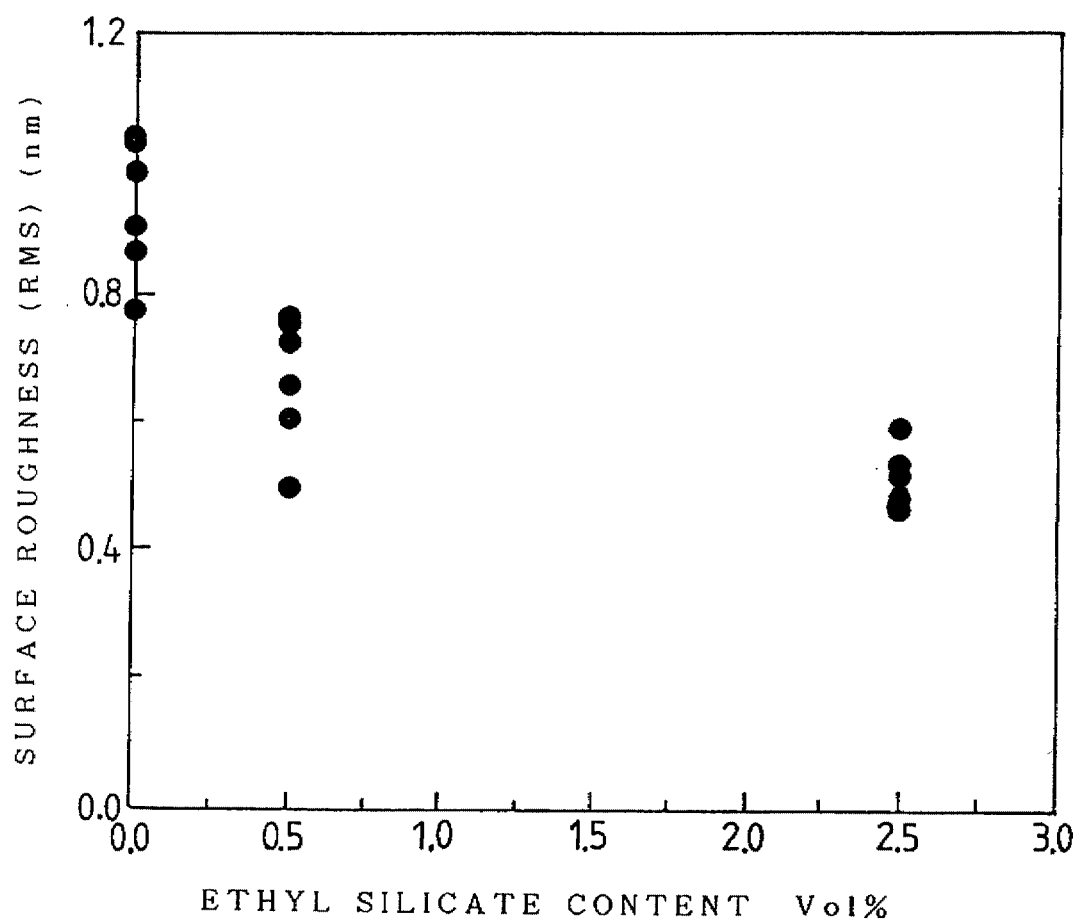
FIG. 3 is a graph showing the relationship between the ethyl silicate content and the flatness of wafer surfaces determined by Examples 3 and 4 and Comparative Example 2.

To achieve Examples 3 and 4 and Comparative Example 2, the condition specified above was changed such that the amount of Ethyl Silicate 28 was selected as 0 vol % for Comparative Example 2, 0.5 vol % for Example 3, and 2.5 vol % for Example 4. In every Example, the pure water content was properly adjusted such that the total amount of the polishing agent was equal to 100 vol %. Under the condition selected for each Example, five sample wafers were polished and the polished sample wafers were measured for surface roughness in the same manner as Example 1. The results of the surface roughness measurement are shown in FIG. 3. As is apparent from FIG. 3, the surface roughness is greatly improved by Ethyl Silicate 28 contained, as an additive, in the polishing agent. This is true for both Examples 3 and 4 having different Ethyl Silicate 28 contents. The same effect has been confirmed by experiments even when n-type wafers have been used in place of the p-type wafers used in the examples described above.

It is apparent from the foregoing description that a polishing agent of the present invention used in combination with a rigid polishing pad is able to provide, through a single-stage polishing process, a polished silicon wafer having an excellent flatness and whose surface has a roughness comparable to one obtained by the conventional final polishing process using a soft polishing pad. The present invention can obviate the use of the conventional final polishing process and hence is able to simplify the overall polishing process.

Obviously, various minor changes and modifications of the present invention are possible in the light of the above teaching. It is therefore to be understood that within the scope of the appended claims the invention may be practiced otherwise than as specifically described.

What is claimed is:

1. A polishing agent composition for polishing a silicon wafer, comprising a colloidal silica polishing agent and ethyl silicate in an amount in the range of 0.1 to 10.0 percent by volume relative to the total amount of said polishing agent composition.

2. A polishing agent as recited in claim 1, wherein said ethyl silicate comprises ethyl silicate monomer.

3. A polishing agent as recited in claim 1, wherein said ethyl silicate comprises ethyl silicate polymer.

4. A polishing agent as recited in claim 1, wherein said ethyl silicate comprises ethyl silicate monomer and ethyl silicate polymer.

5. A method of polishing a silicon wafer, comprising applying a polishing agent composition in accordance with claim 1 to a rigid polishing pad and polishing a silicon wafer with said polishing pad under a polishing load.

6. A method according to claim 5, wherein said polishing pad has a hardness in the range of 80 to 95 according to Asker C-scale.

* * * * *